(12) United States Patent
Hikichi

(10) Patent No.: US 11,408,946 B2
(45) Date of Patent: Aug. 9, 2022

(54) MAGNETIC SENSOR CIRCUIT

(71) Applicant: ABLIC Inc., Tokyo (JP)

(72) Inventor: Tomoki Hikichi, Tokyo (JP)

(73) Assignee: ABLIC Inc., Tokyo (JP)

( * ) Notice: Subject to any disclaimer, the term of this patent is extended or adjusted under 35 U.S.C. 154(b) by 0 days.

(21) Appl. No.: 17/387,933

(22) Filed: Jul. 28, 2021

(65) Prior Publication Data

US 2022/0034979 A1 Feb. 3, 2022

(30) Foreign Application Priority Data

Aug. 3, 2020 (JP) ................................ 2020-131417

(51) Int. Cl.
    *G01R 33/02* (2006.01)
    *G01R 19/00* (2006.01)
    *G01R 15/20* (2006.01)

(52) U.S. Cl.
    CPC ......... *G01R 33/0206* (2013.01); *G01R 15/20* (2013.01); *G01R 19/0084* (2013.01)

(58) Field of Classification Search
    CPC . G01R 33/0206; G01R 15/20; G01R 19/0084
    See application file for complete search history.

(56) References Cited

U.S. PATENT DOCUMENTS 10,191,124 B2 * 1/2019 Hikichi ............. G01R 33/0017
2009/0033324 A1   2/2009 Tomida et al.

FOREIGN PATENT DOCUMENTS

JP          2009031225          2/2009

* cited by examiner

*Primary Examiner* — Walter L Lindsay, Jr.
*Assistant Examiner* — Milton Gonzalez
(74) *Attorney, Agent, or Firm* — JCIPRNET

(57) ABSTRACT

Provided is a magnetic sensor circuit and includes: a magnetic sensor outputting a first sensor signal based on a magnetic flux density in a first direction; a magnetic sensor outputting a second sensor signal based on a magnetic flux density in a second direction orthogonal to the first direction; a signal processing circuit respectively obtaining a first detection signal and a second detection signal which transition between low and high levels based on the first magnetic sensor signal and the second magnetic sensor signal; a driver outputting a first output voltage based on the first detection signal; a driver outputting a second output voltage based on the second detection signal; and a voltage monitoring circuit generating mode signals whose signal levels transition based on transitions of voltage levels of the first output voltage and the second output voltage input thereto.

7 Claims, 10 Drawing Sheets

MAGNETIC SENSOR CIRCUIT

CROSS REFERENCE TO RELATED APPLICATIONS

This application claims the priority benefit of Japanese Patent Application No. 2020-131417, filed on Aug. 3, 2020. The entirety of the above-mentioned patent application is hereby incorporated by reference herein and made a part of this specification.

BACKGROUND

Technical Field

The present invention relates to a magnetic sensor circuit.

Related Art

The magnetic sensor circuit may be configured by sharing a test terminal for entering an operation inspection mode (hereinafter, referred to as "test mode") with an existing terminal due to the limitation of the number of terminals. For example, a magnetic sensor circuit in which the test terminal also serves as an output terminal has been proposed (for example, see Patent literature 1: Japanese Patent Application Laid-Open No. 2009-31225).

In a magnetic field detection device described in Patent literature 1, a signal for transitioning a mode (hereinafter referred to as "mode transition signal"), such as transitioning the mode from a normal mode for normal operation to the test mode, is forcibly input from the output terminal. The mode transition signal is at a level which cannot occur in the normal mode. The magnetic field detection device receives and detects the mode transition signal based on a level of the received signal, and thereby switches the mode from the normal mode to the test mode.

However, in a magnetic sensor circuit such as the magnetic field detection device described in Patent literature 1, when short circuit or the like occurs in the output terminal, the magnetic sensor circuit may unintentionally enter the test mode.

SUMMARY

The present invention has an object to provide a magnetic sensor circuit capable of reducing unintended mode transitions.

In accordance with one embodiment of the present invention, a magnetic sensor circuit including: a first magnetic sensor which detects a magnetic flux density in a first direction and outputs a first sensor signal based on the detected magnetic flux density in the first direction; a second magnetic sensor which detects a magnetic flux density in a second direction orthogonal to the first direction and outputs a second sensor signal based on the detected magnetic flux density in the second direction; a signal processing circuit which includes a mode signal input port from which mode signals are received, a first sensor signal input port from which the first sensor signal is received, and a second sensor signal input port from which the second sensor signal is received, and which is configured to switch between a normal mode and a test mode in which a predetermined operation different from that of the normal mode is performed, wherein in the normal mode, a first detection signal which transitions between low and high levels is output based on the first sensor signal, while a second detection signal which transitions between low and high levels is output based on the second sensor signal; a first driver from which the first detection signal is received in the normal mode while a test signal is received in the test mode, and which outputs a first output voltage based on the received first detection signal or the received test signal; a second driver from which the second detection signal is received in the normal mode while the test signal is received in the test mode, and which outputs a second output voltage based on the received second detection signal or the received test signal; and a voltage monitoring circuit which receives the first output voltage and the second output voltage, and generates the mode signals having a plurality of different signal levels in accordance with transition patterns of voltage levels of the received first output voltage and the received second output voltage.

According to the magnetic sensor circuit, unintended mode transitions can be reduced.

DESCRIPTION OF THE EMBODIMENTS

Hereinafter, a magnetic sensor circuit according to an embodiment of the present invention is described with reference to the drawings.

Figure 1:
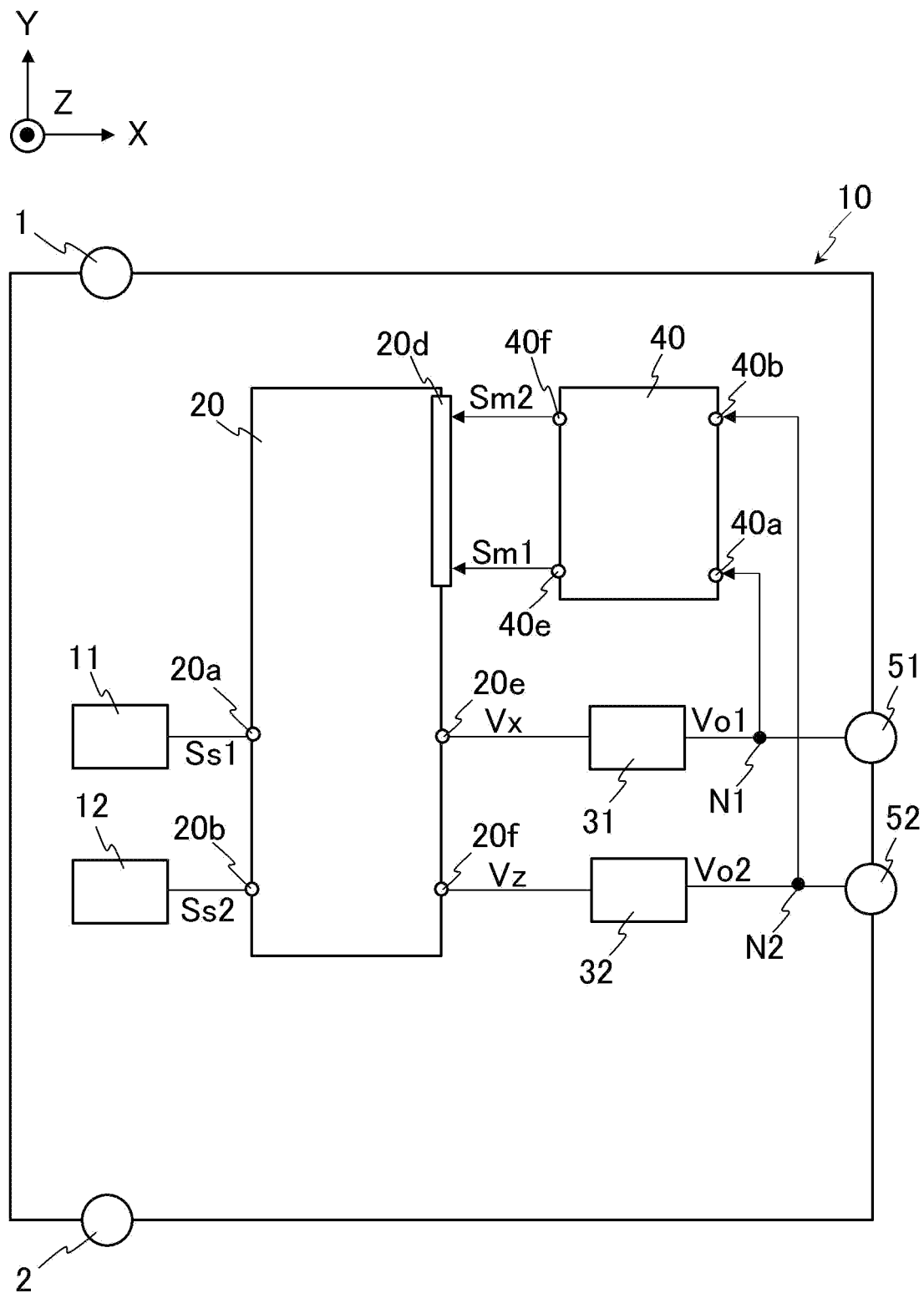
FIG. 1 is a circuit diagram illustrating a first configuration example of a magnetic sensor circuit according to an embodiment.

FIG. 1 is a circuit diagram of a magnetic sensor circuit 10 which is an example (a first configuration example) of the magnetic sensor circuit according to the embodiment. The X-axis, Y-axis, and Z-axis illustrated in FIG. 1 are an X-axis, a Y-axis, and a Z-axis in an XYZ three-dimensional orthogonal coordinate system. That is, the X-axis, Y-axis, and Z-axis are orthogonal to each other.

Figure 2:
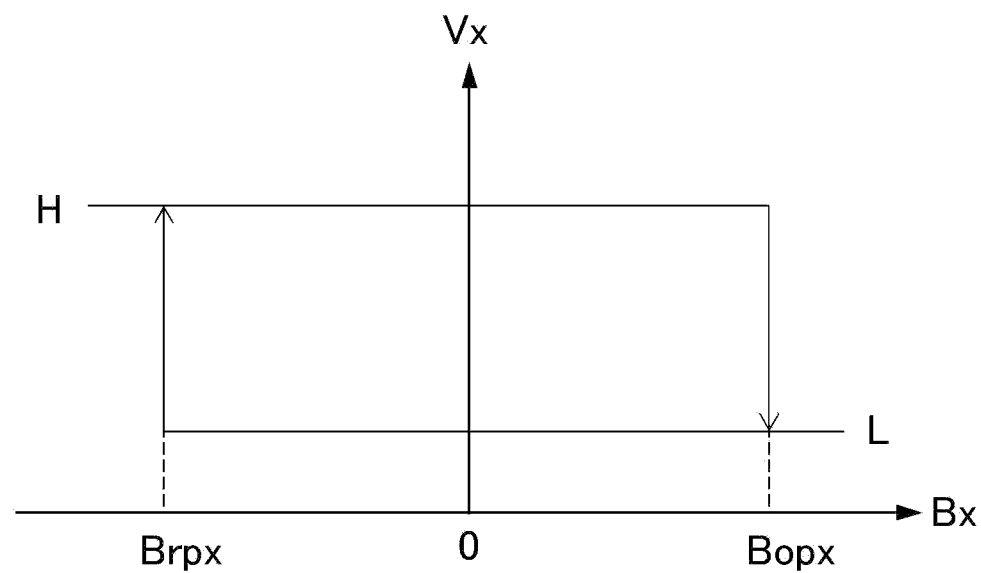
FIG. 2 is a characteristic diagram illustrating a first sensor signal for a magnetic flux density in a first direction.
Figure 3:
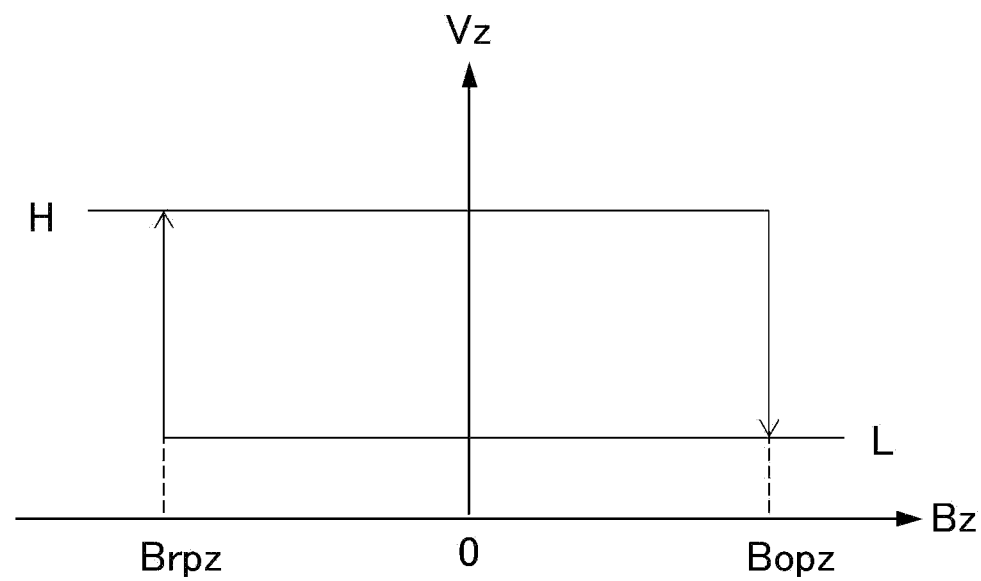
FIG. 3 is a characteristic diagram illustrating a second sensor signal for a magnetic flux density in a second direction.

FIG. 2 is a characteristic diagram illustrating a voltage Vx serving as a first detection signal for a magnetic flux density Bx. FIG. 3 is a characteristic diagram illustrating a voltage Vz serving as a second detection signal for a magnetic flux density Bz.

The magnetic sensor circuit 10 is set in a manner that switching between a normal mode for normal operation and at least one test mode can be made. The magnetic sensor circuit 10 is configured to be capable of detecting the magnetic flux density Bx which is an X-axis direction component and the magnetic flux density Bz which is a Z-axis direction component of the magnetic flux density existing in a detectable range, and outputting a first output voltage Vo1 in accordance with the magnetic flux density Bx and a second output voltage Vo2 in accordance with the magnetic flux density Bz.

The magnetic sensor circuit 10 includes magnetic sensors 11 and 12, a signal processing circuit 20, drivers 31 and 32, and a voltage monitoring circuit 40. In addition, the magnetic sensor circuit 10 includes power supply terminals 1 and 2, and output terminals 51 and 52. A voltage VDD, which is a first power supply voltage, is supplied to the power supply terminal 1. A voltage VSS, which is a second power supply voltage, is supplied to the power supply terminal 2.

The magnetic sensor 11 serving as a first magnetic sensor detects the magnetic flux density Bx in the X-axis direction serving as a first direction, and contains an output port which outputs a first sensor signal Ss1 based on the detected magnetic flux density Bx.

The magnetic sensor 12 serving as a second magnetic sensor detects the magnetic flux density Bz in the Z-axis direction serving as a second direction, and contains an output port which outputs a second sensor signal Ss2 based on the detected magnetic flux density Bz.

The signal processing circuit 20 contains an input port 20a serving as a first sensor signal input port, an input port 20b serving as a second sensor signal input port, and an input port 20d serving as a mode signal input port. In addition, the signal processing circuit 20 contains an output port 20e which outputs the first detection signal and an output port 20f which outputs the second detection signal.

The first detection signal and the second detection signal are respectively generated by the signal processing circuit 20 based on the first sensor signal Ss1 and the second sensor signal Ss2. The first detection signal and the second detection signal are logical signals which transition between a low level (denoted as "L" in FIG. 2 and the following diagrams) and a high level (denoted as "H" in FIG. 2 and the following diagrams). The voltage Vx serving as the first detection signal and the voltage Vz serving as the second detection signal respectively exhibit hysteresis characteristics (see FIGS. 2 and 3).

The driver 31 serving as a first driver contains an input port to which the voltage Vx is input, and an output port which outputs the first output voltage Vo1 based on the voltage Vx input to the input port. The output port of the driver 31 is connected to the output terminal 51.

The driver 32 serving as a second driver contains an input port to which the voltage Vz is input, and an output port which outputs the second output voltage Vo2 based on the voltage Vz input to the input port. The output port of the driver 32 is connected to the output terminal 52.

The voltage monitoring circuit 40 contains an input port 40a to which the first output voltage Vo1 is input and an input port 40b to which the second output voltage Vo2 is input. The input port 40a is connected to the output port of the driver 31, and the input port 40b is connected to the output port of the driver 32. A connection point of the input port 40a, the output port of the driver 31, and the output terminal 51 is a node N1. A connection point of the input port 40b, the output port of the driver 32, and the output terminal 52 is a node N2.

In addition, the voltage monitoring circuit 40 contains an output port 40e which outputs a mode signal Sm1, and an output port 40f which outputs a mode signal Sm2 which is a second mode signal generated based on the second output voltage Vo2. Here, the mode signal Sm1 is a first mode signal generated based on the first output voltage Vo1, and the mode signal Sm2 is a second mode signal generated based on the second output voltage Vo2.

The mode signal Sm1 and the mode signal Sm2 are respectively signals which transition between low and high levels. The first output voltage Vo1 and the second output voltage Vo2 are respectively generated by the voltage monitoring circuit 40 based on the voltage Vx and the voltage Vz.

The output terminals 51 and 52 are respectively connected to the input ports 40a and 40b which serve as output voltage input ports in the voltage monitoring circuit 40, and constitute a terminal group. The output terminals 51 and 52 are configured to be connectable to an external circuit (not illustrated). In addition, the output terminal 51 is configured to be capable of supplying the first output voltage Vo1 to the connected external circuit. The output terminal 52 is configured to be capable of supplying the second output voltage Vo2 to the connected external circuit.

Figure 4:
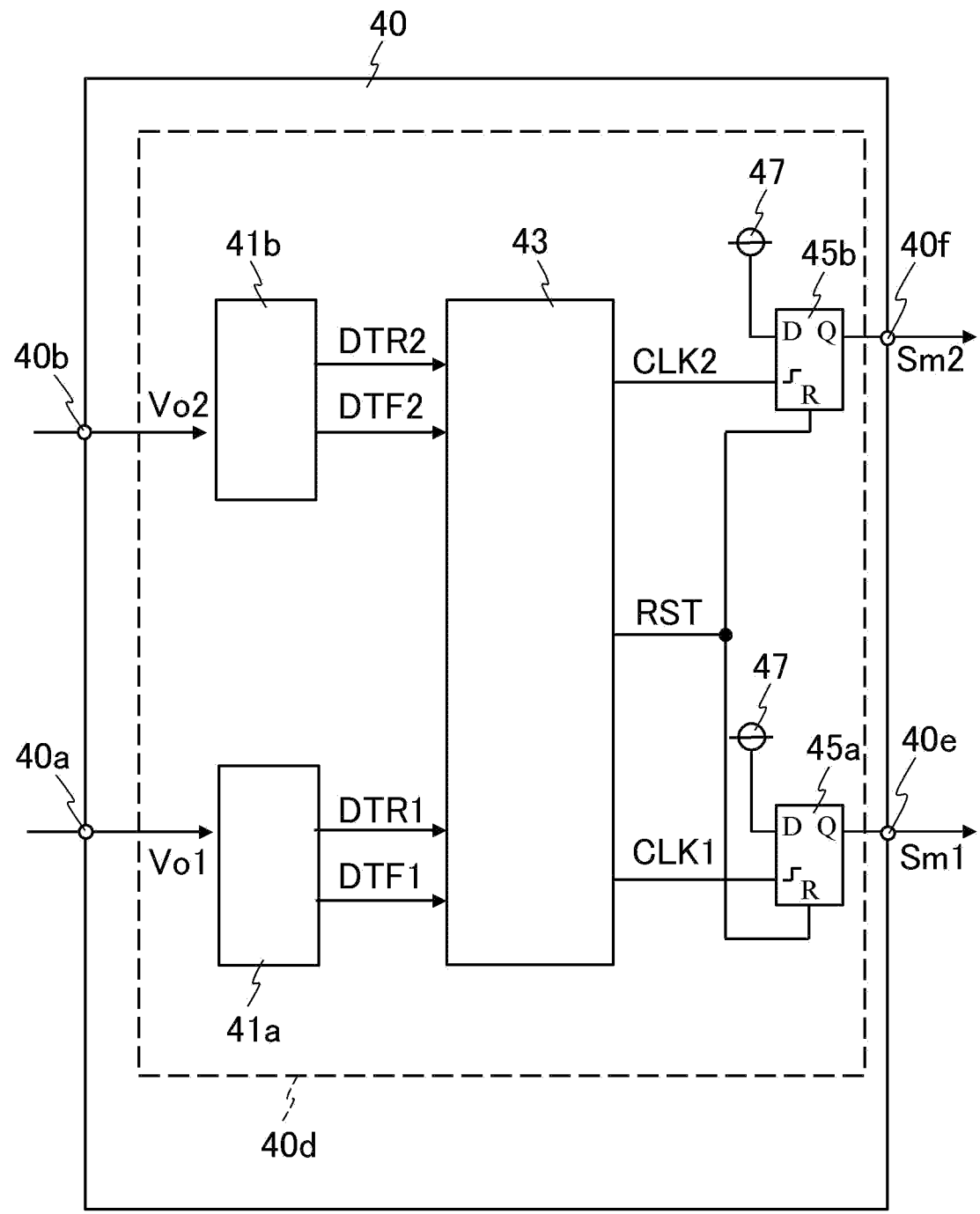
FIG. 4 is a circuit diagram illustrating a configuration example of a voltage monitoring circuit in the magnetic sensor circuit according to the embodiment.

FIG. 4 is a circuit diagram illustrating a configuration example of the voltage monitoring circuit 40. The voltage monitoring circuit 40 contains: the input ports 40a and 40b serving as the output voltage input ports; a mode signal generation circuit 40d which generates the mode signal Sm1 based on the first output voltage Vo1, and which generates the mode signal Sm2 based on the second output voltage Vo2; and the output ports 40e and 40f.

The mode signal generation circuit 40d includes a first edge detection circuit 41a and a second edge detection circuit 41b, a determination circuit 43, and latch circuits 45a and 45b serving as signal generation circuits.

The first edge detection circuit 41a contains an output voltage input port connected to the input port 40a, a first output port connected to a first input port of the determination circuit 43, and a second output port connected to a second input port of the determination circuit 43.

The first edge detection circuit 41a is configured to detect a rising edge and a falling edge of the first output voltage Vo1, and generate a first rising edge detection signal DTR1 corresponding to the detected rising edge and a first falling edge detection signal DTF1 corresponding to the detected falling edge.

The second edge detection circuit 41b differs from the first edge detection circuit 41a in that an output voltage to be signal-processed is the second output voltage Vo2, but the configuration is the same as that of the first edge detection circuit 41a. That is, the second edge detection circuit 41b is configured to detect a rising edge and a falling edge of the second output voltage Vo2, and generate a second rising edge detection signal DTR2 corresponding to the detected rising edge and a second falling edge detection signal DTF2 corresponding to the detected falling edge.

The determination circuit 43 includes first to sixth input ports, an RST output port, a CLK1 output port, and a CLK2 output port. In the determination circuit 43, the first to sixth input ports are respectively connected as follows.

The first input port is connected to the first output port of the first edge detection circuit 41a. The second input port is connected to the second output port of the first edge detection circuit 41a. The third input port is connected to the input port 40a. The fourth input port is connected to the first output port of the second edge detection circuit 41b. The fifth input port is connected to the second output port of the second edge detection circuit 41b. The sixth input port is connected to the input port 40b.

The determination circuit 43 is configured to determine the presence or absence of a specific transition pattern based on the first rising edge detection signal DTR1, the first falling edge detection signal DTF1, the second rising edge detection signal DTR2, and the second falling edge detection signal DTF2, and generate a first clock signal CLK1, a second clock signal CLK2, and a reset signal RST which serve as determination result signals indicating the determination result.

The specific transition patterns set in the determination circuit 43 (hereinafter referred to as "specific transition patterns") include a plurality of patterns. The maximum number X of the specific transition patterns which can be set in the determination circuit 43 depends on the number n (natural number) of output voltages input to the determination circuit 43. Specifically, $X=2^n$ is satisfied. In the determination circuit 43 to which the first output voltage Vo1 and the second output voltage Vo2 are input, that is, the determination circuit 43 with n=2, a maximum of 4 ($=2^2$) patterns can be set.

Here, the four transition patterns which can be set in the determination circuit 43 are set as first to fourth patterns.

For example, the first pattern is a pattern in which both a voltage level of the first output voltage Vo1 and a voltage level of the second output voltage Vo2 transition from a low level to a high level within a predetermined time. The predetermined time is a time width considered to be simultaneous and is set in advance.

The second pattern is a pattern in which the voltage level of the first output voltage Vo1 transitions from a low level to a high level and the voltage level of the second output voltage Vo2 transitions from a high level to a low level within the predetermined time.

The third pattern is a pattern in which the voltage level of the first output voltage Vo1 transitions from a high level to a low level and the voltage level of the second output voltage Vo2 transitions from a low level to a high level within the predetermined time.

The fourth pattern is a pattern in which both the voltage level of the first output voltage Vo1 and the voltage level of the second output voltage Vo2 transition from a high level to a low level within the predetermined time.

The first latch circuit 45a and the second latch circuit 45b are configured by so-called D latch circuits, and are supplied with power from a power supply terminal 47. The first latch circuit 45a contains an input terminal (D terminal) connected to the CLK1 output port, an R terminal connected to the RST output port of the determination circuit 43, and an output terminal (Q terminal) connected to the output port 40e. The second latch circuit 45b contains an input terminal (D terminal) connected to the CLK2 output port, an R terminal connected to the RST output port of the determination circuit 43, and an output terminal (Q terminal) connected to the output port 40f.

The action and effect of the magnetic sensor circuit 10 described above are described. First, an operation in the normal mode of the magnetic sensor circuit 10 is described.

Figure 5:
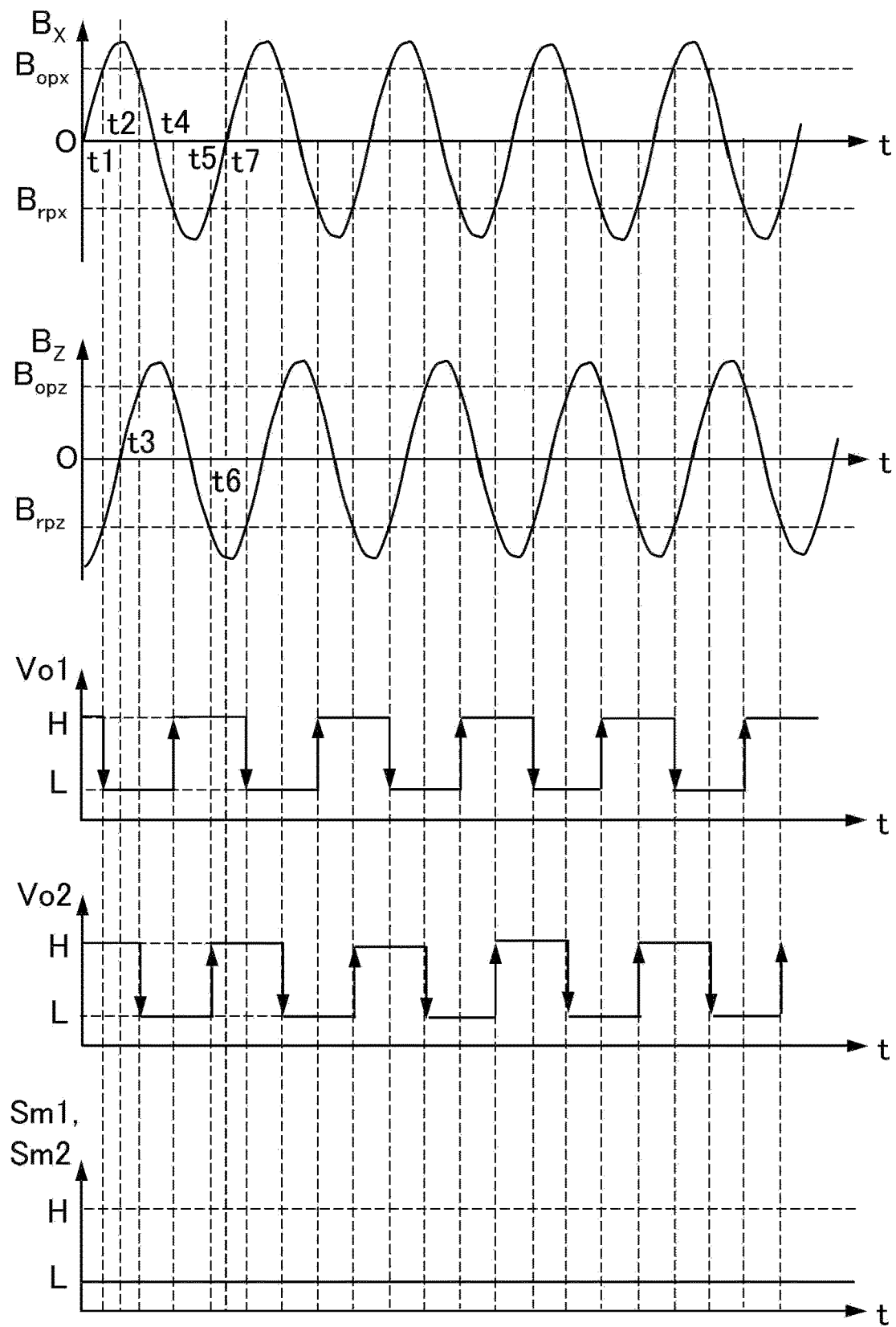
FIG. 5 is an explanatory diagram illustrating time transitions of the magnetic flux density in the first direction, the magnetic flux density in the second direction, a first output voltage, a second output voltage, a first mode signal, and a second mode signal in a normal mode of the magnetic sensor circuit according to the embodiment.

FIG. 5 is an explanatory diagram illustrating time transitions of the magnetic flux density Bx, the magnetic flux density Bz, the first output voltage Vo1, the second output voltage Vo2, the mode signal Sm1, and the mode signal Sm2 in the normal mode of the magnetic sensor circuit 10.

In the normal mode, an alternating magnetic field with a phase shift of 90 degrees is formed around the magnetic sensor circuit 10. The magnetic flux density Bx and the magnetic flux density Bz detected by the magnetic sensor circuit 10 are detected as sine waves having the same maximum amplitude and cycle. In addition, the magnetic flux density Bx and the magnetic flux density Bz are shifted by 90 degrees in phase.

The magnetic flux densities Bx and Bz illustrated in FIG. 5 are described focusing on a time from t=0 (zero) to t7 ($0 \le t \le t7$). The magnetic flux densities Bx and Bz are sine waves with a period from the time t=0 to the time t=t6 as one cycle. Here, magnetic flux densities Bopx and Bopz are respectively operation points of the magnetic flux densities Bx and Bz. Magnetic flux densities Brpx and Brpz are respectively return points of the magnetic flux densities Bx and Bz. In addition, the magnetic flux densities Bx and Bz above 0 represents an S-pole, and the magnetic flux densities Bx and Bz below 0 represents an N-pole.

The magnetic flux density Bx is 0 (zero) at the time t=0. Thereafter, the magnetic flux density of the S-pole increases, and the magnetic flux density Bx becomes the magnetic flux density Bopx at the time t=t1 and becomes the maximum value at the time t=t2. After the time t=t2, the magnetic flux density of the S-pole decreases, and the magnetic flux density Bx becomes the magnetic flux density Bopx at the time t=t3 and then reaches 0 (t3<t<t4).

After the magnetic flux density Bx reaches 0, the polarity of the magnetic flux density Bx is reversed, the magnetic flux density of the N-pole increases, and the magnetic flux density Bx becomes the magnetic flux density Brpx at the time t=t4. Furthermore, after the magnetic flux density of the N-pole becomes the maximum value (t4<t<t5), the magnetic flux density of the N-pole decreases, and the magnetic flux density Bx becomes the magnetic flux density Brpx at the time t=t5 and reaches 0 at the time t=t6. After that, the increase/decrease from the time t=0 to t=t6 ($0 \le t \le t6$) is repeated cyclically. Thus, the magnetic flux density Bx, at the time t=t7 (=t6+t1) when t1 elapses from the time t=t6, becomes the magnetic flux density Bopx.

The magnetic flux density Bz is, for example, delayed by 90 degrees in phase with respect to the magnetic flux density Bx. That is, as for the magnetic flux density Bz, the magnetic flux density of the N-pole becomes the maximum value at the time t=0, and then the magnetic flux density of the N-pole decreases with the passage of time. The magnetic flux density Bz becomes the magnetic flux density Brpz at the time t=t1, and reaches 0 at the time t=t2. After the magnetic flux density Bz reaches 0, the polarity of the magnetic flux density Bz is reversed and the magnetic flux density of the S-pole increases, and the magnetic flux density Bz becomes the magnetic flux density Bopz at the time t=t3.

After the time t=t3, the magnetic flux density of the S-pole further increases to become the maximum value (t3<t<t4), then starts to decrease, becomes the magnetic flux density Bopz at the time t=t4, and then reaches 0 (t4<t<t5). After the magnetic flux density Bz reaches 0, the polarity of the magnetic flux density Bz is reversed and the magnetic flux density of the N-pole increases, the magnetic flux density Bz becomes the magnetic flux density Brpz at the time t=t5, and the magnetic flux density of the N-pole further becomes the maximum value at the time t=t6. After the time t=t6, the increase/decrease from the time t=0 to t6 (0≤t<t6) is repeated cyclically. Thus, the magnetic flux density Bz, at the time t=t7 (=t6+t1) when t1 elapses from the time t=t6, becomes the magnetic flux density Brpz.

The magnetic sensor 11 detects the magnetic flux density Bx and transmits the first sensor signal Ss1 corresponding to the detected magnetic flux density Bx to the signal processing circuit 20. The magnetic sensor 12 detects the magnetic flux density Bz and transmits the second sensor signal Ss2 corresponding to the detected magnetic flux density Bz to the signal processing circuit 20.

The signal processing circuit 20 receives the first sensor signal Ss1, and then transmits, to the driver 31, the voltage Vx in accordance with the magnetic flux density Bx corresponding to the first sensor signal Ss1.

The voltage Vx is at a high level during a period when the time t satisfies 0≤t<t1 and t4≤t<t6. On the other hand, the voltage Vx is at a low level during a period when the time t satisfies t1≤t<t4.

In addition, the signal processing circuit 20 receives the second sensor signal Ss2, and then transmits, to the driver 32, the voltage Vz in accordance with the magnetic flux density Bz corresponding to the second sensor signal Ss2. The voltage Vz is at a high level during a period when the time t satisfies 0≤t<t3 and t5≤t<t6. On the other hand, the voltage Vz is at a low level during a period when the time t satisfies t3≤t<t5.

The driver 31 receives the voltage Vx as the first detection signal, and then transmits the first output voltage Vo1 to the output terminal 51 and the voltage monitoring circuit 40 based on the voltage Vx as the first detection signal. The driver 32 receives the voltage Vz as the second detection signal, and then transmits the second output voltage Vo2 to the output terminal 52 and the voltage monitoring circuit 40 based on the voltage Vz as the second detection signal.

The first output voltage Vo1 and the second output voltage Vo2 cyclically transition between a low level and a high level. During a period when the time t is 0≤t<t6, that is, in one cycle, the first output voltage Vo1 maintains a high level during the period of 0≤t<t1, transitions to a low level at the time t=t1, maintains the low level during the period of t1≤t<t4, transitions to a high level at the time t=t4, and maintains the high level during the period of t4≤t<t6.

During a period when the time t is 0≤t<t6, that is, in one cycle, the second output voltage Vo2 maintains a high level during the period of 0≤t<t3, transitions to a low level at the time t=t3, maintains the low level during the period of t3≤t<t5, transitions to a high level at the time t=t5, and maintains the high level during the period of t5≤t<t6.

The transitions of the first output voltage Vo1 and the second output voltage Vo2 after the time t=t6 are the same as the transitions of the first output voltage Vo1 and the second output voltage Vo2 during the period when the time t is 0≤t<t6. That is, the transitions of the voltage levels of the first output voltage Vo1 and the second output voltage Vo2 during the period when the time t is 0≤t<t6 are cyclically repeated.

As described above, under a condition in which the normal mode is selected, the cycle of the first output voltage Vo1 is the same as the cycle of the second output voltage Vo2. In addition, under the condition in which the normal mode is selected, the first output voltage Vo1 is shifted by ¼ cycle from the second output voltage Vo2, and thus the voltage levels of the two output voltages do not transition at the same time.

The first output voltage Vo1 is supplied to an external circuit (not illustrated) via the voltage monitoring circuit 40 and the output terminal 51. The second output voltage Vo2 is supplied to the external circuit via the voltage monitoring circuit 40 and the output terminal 52.

The voltage monitoring circuit 40 generates the mode signal Sm1 and the mode signal Sm2 in accordance with the transition patterns of the supplied first output voltage Vo1 and the supplied second output voltage Vo2, and transmits the mode signal Sm1 and the mode signal Sm2 to the signal processing circuit 20. A plurality of mode signals, namely the mode signal Sm1 and the mode signal Sm2 respectively have different signal levels of a low level and a high level.

The signal processing circuit 20 receives the mode signals Sm1 and Sm2 from the voltage monitoring circuit 40, and then recognizes the received mode signals Sm1 and Sm2 as, for example, one 2-bit signal. If the received mode signals Sm1 and Sm2 are recognized as one 2-bit signal, the signal processing circuit 20 can recognize one normal mode and up to three different test modes.

For example, in a case where the normal mode and the mode signals Sm1 and Sm2 are both associated with a low level, during the execution of the normal mode, as illustrated in FIG. 5, the first mode signal Sm1 and the second mode signal Sm2 are both output at a low level during the period when the time t is 0≤t<t6.

Next, an operation in the test mode of the magnetic sensor circuit 10, in which one normal mode and three test modes consisting of first, second, and third test modes TM1, TM2, and TM3 as an example of the test mode are set, is described.

In the magnetic sensor circuit 10 in which one normal mode and three test modes are set, four specific transition patterns are set in the voltage monitoring circuit 40, more specifically, in the determination circuit 43, from the transition patterns of the voltage levels of the first output voltage Vo1 and the second output voltage Vo2.

The four specific transition patterns set in the determination circuit 43 are the first to fourth patterns described above. The first to fourth patterns serving as the four specific transition patterns are associated with the signal levels of the mode signals Sm1 and Sm2. In addition, in the signal processing circuit 20, the signal levels of the mode signals Sm1 and Sm2 are associated with four modes which are one normal mode and the first, second and third test modes TM1, TM2 and TM3. Here, as an example of association among the first to fourth patterns, the signal levels of the mode signals Sm1 and Sm2, and the modes, the following association case is described.

The first pattern is associated with the mode signal Sm1 of a high level and the mode signal Sm2 of a low level. The mode signal Sm1 of a high level and the mode signal Sm2 of a low level are associated with the first test mode TM1. That is, the first pattern is associated with the first test mode TM1.

The second pattern is associated with the mode signal Sm1 of a low level and the mode signal Sm2 of a high level. The mode signal Sm1 of a low level and the mode signal Sm2 of a high level are associated with the second test mode TM2. That is, the second pattern is associated with the second test mode TM2.

The third pattern is associated with the mode signal Sm1 of a high level and the mode signal Sm2 of a high level. The mode signal Sm1 of a high level and the mode signal Sm2 of a high level are associated with the third test mode TM3. The third pattern is associated with the third test mode TM3.

The fourth pattern is associated with the mode signal Sm1 of a low level and the mode signal Sm2 of a low level. The mode signal Sm1 of a low level and the mode signal Sm2 of a low level are associated with the normal mode. That is, the fourth pattern is associated with the normal mode.

Figure 6A:
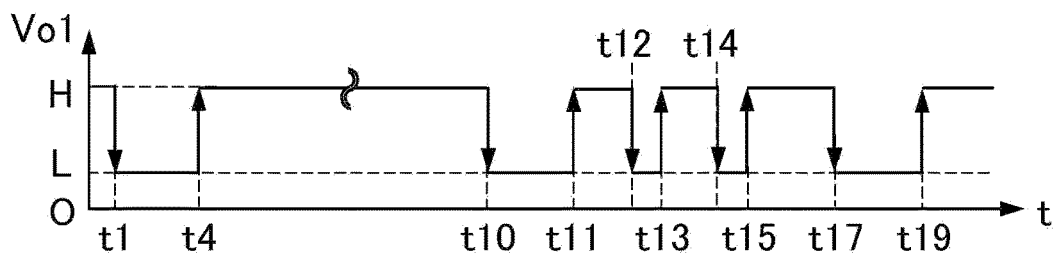
FIG. 6A is an explanatory diagram illustrating a time transition of the first output voltage in a test mode of the magnetic sensor circuit according to the embodiment.
Figure 6B:
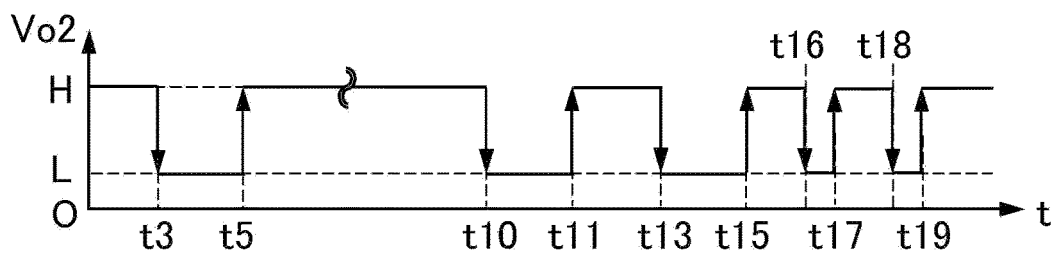
FIG. 6B is an explanatory diagram illustrating a time transition of the second output voltage in the test mode of the magnetic sensor circuit according to the embodiment.
Figure 6C:
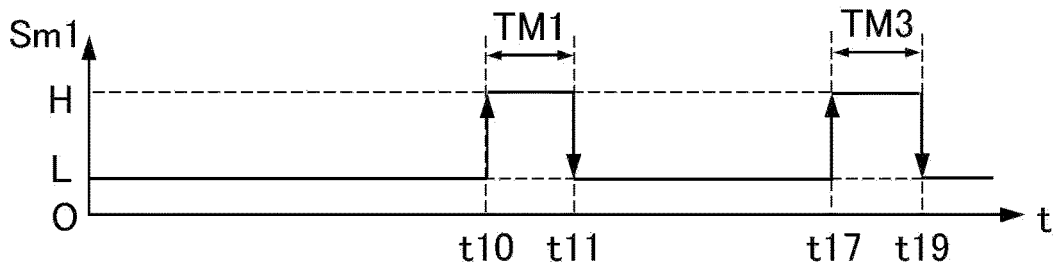
FIG. 6C is an explanatory diagram illustrating a time transition of the first mode signal in the test mode of the magnetic sensor circuit according to the embodiment.
Figure 6D:
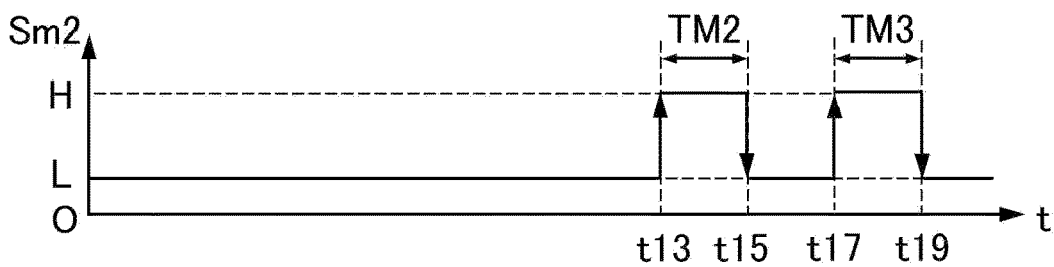
FIG. 6D is an explanatory diagram illustrating a time transition of the second mode signal in the test mode of the magnetic sensor circuit according to the embodiment.

FIGS. 6A and 6B are respectively explanatory diagrams illustrating time transitions of the first output voltage Vo1 and the second output voltage Vo2 in the test mode of the magnetic sensor circuit 10. FIGS. 6C and 6D are respectively explanatory diagrams illustrating time transitions of the mode signals Sm1 and Sm2.

Prior to switching the mode to the test mode, an inspection device including an external circuit is connected to the output terminals 51 and 52. The inspection device has a function of generating a predetermined magnetic field and a function of applying the first output voltage Vo1 and the second output voltage Vo2 from the outside. The inspection device applies the first output voltage Vo1 and the second output voltage Vo2 from the predetermined magnetic field or the outside, and thereby supplies, to the voltage monitoring circuit 40, the first output voltage Vo1 and the second output voltage Vo2 whose voltage levels transition in specific transition patterns.

At the time t=t10, the inspection device forcibly applies the first output voltage Vo1 and the second output voltage Vo2, which transition from a high level to a low level, to the output terminal 51 and the output terminal 52 respectively. In response to receiving the first and second output voltages Vo1 and Vo2 from the output terminals 51 and 52 at the time t=t10, the first and second output voltages Vo1 and Vo2 are transmitted to the voltage monitoring circuit 40.

The voltage monitoring circuit 40 receives the first output voltage Vo1 and the second output voltage Vo2 which transition from a high level to a low level at the time t=t10, and thereby generates the mode signals Sm1 and Sm2 associated with the first pattern and transmits the generated mode signals Sm1 and Sm2 to the signal processing circuit 20. The mode signals Sm1 and Sm2 transmitted to the signal processing circuit 20 are respectively at a high level and a low level.

In response to receiving the mode signal Sm1 of a high level and the mode signal Sm2 of a low level, the signal processing circuit 20 transitions the mode of the magnetic sensor circuit 10 to the first test mode TM1 which is a mode associated with the signal levels of the mode signals Sm1 and Sm2. The magnetic sensor circuit 10 in which the first test mode TM1 is selected operates according to the prescribed contents as a first test. The prescribed operation contents are different from the operation contents in the normal mode, such as operating with a reference clock faster than the reference clock selected in the normal mode, supplying an internal power supply voltage higher than the internal power supply voltage selected in the normal mode, and other operation contents.

Subsequently, at the time t=t11, the inspection device forcibly applies the first output voltage Vo1 and the second output voltage Vo2, which transition from a low level to a high level, to the output terminal 51 and the output terminal 52 respectively. In response to receiving from the output terminals 51 and 52 at the time t=t11, the first output voltage Vo1 and the second output voltage Vo2, which transition from a low level to a high level, are transmitted to the voltage monitoring circuit 40.

The voltage monitoring circuit 40 receives the first output voltage Vo1 and the second output voltage Vo2 which transition from a low level to a high level at the time t=t11, and thereby generates the mode signals Sm1 and Sm2 associated with the fourth pattern and transmits the generated mode signals Sm1 and Sm2 to the signal processing circuit 20.

In response to receiving the mode signals Sm1 and Sm2 associated with the fourth pattern at the time t=t11, the signal processing circuit 20 transitions the mode of the magnetic sensor circuit 10 to the normal mode associated with the signal levels of the mode signals Sm1 and Sm2.

Subsequently, prior to transitioning the magnetic sensor circuit 10 to the second test mode TM2 at the time t=t13, the inspection device forcibly applies the first output voltage Vo1 which transitions from a high level to a low level from the output terminal 51 at the time t=t12 before the time t=t13.

Subsequently, at the time t=t13, the inspection device forcibly applies the first output voltage Vo1 which transitions from a low level to a high level from the output terminal 51, and forcibly applies the second output voltage Vo2 which transitions from a high level to a low level from the output terminal 52.

The voltage monitoring circuit 40 receives the first output voltage Vo1 which transitions from a low level to a high level and the second output voltage Vo2 which transitions from a high level to a low level at the time t=t13, generates the mode signals Sm1 and Sm2 associated with the second pattern, and transmits the generated mode signals Sm1 and Sm2 to the signal processing circuit 20.

In response to receiving the mode signals Sm1 and Sm2 associated with the second pattern at the time t=t13, the signal processing circuit 20 transitions the mode of the magnetic sensor circuit 10 to the second test mode TM2. The magnetic sensor circuit 10 in which the second test mode TM2 is selected operates according to the prescribed contents as a second test. The operation prescribed as the second test is different from the operations in the normal mode and the first test.

Subsequently, prior to transitioning the magnetic sensor circuit 10 to the normal mode at the time t=t15, the inspection device forcibly applies the first output voltage Vol which transitions from a high level to a low level from the output terminal 51 at the time t=t14, which is a timing before the time t=t15 and before which a test step executed in the second test mode TM2 has been completed. The operations of the magnetic sensor circuit 10 at the time t=t14 and t15 are respectively the same as the operations of the magnetic sensor circuit 10 at the time t=t12 and t11.

Subsequently, prior to transitioning the magnetic sensor circuit 10 to the third test mode TM3 at the time t=t17, the inspection device forcibly applies the second output voltage Vo2 which transitions from a high level to a low level from the output terminal 52 at the time t=t16 which is a timing after the time t=t15 and before the time t=t17.

Subsequently, at the time t=t17, the inspection device forcibly applies the first output voltage Vo1 and the second output voltage Vo2 which transition from a high level to a low level from the output terminal 51 and the output terminal 52 respectively.

The voltage monitoring circuit 40 receives the first output voltage Vo1 which transitions from a high level to a low level and the second output voltage Vo2 which transitions from a low level to a high level at the time t=t17, generates the mode signals Sm1 and Sm2 associated with the third pattern, and transmits the generated mode signals Sm1 and Sm2 to the signal processing circuit 20.

In response to receiving the mode signals Sm1 and Sm2 associated with the third pattern at the time t=t17, the signal processing circuit 20 transitions the mode of the magnetic sensor circuit 10 to the third test mode TM3. In the magnetic sensor circuit 10 in which the third test mode TM3 is selected, the operation prescribed as a third test is different from the operations in the normal mode and the first and second tests.

Subsequently, prior to transitioning the magnetic sensor circuit 10 to the normal mode at the time t=t19, the inspection device forcibly applies the second output voltage Vo2 which transitions from a high level to a low level from the output terminal 52 at the time t=t18 which is a timing before the time t=t19 and before which a test step executed in the third test mode TM3 has been completed. The operation of the magnetic sensor circuit 10 at the time t=t19 is the same as the operation of the magnetic sensor circuit 10 at the time t=t11 and t15.

Next, an operation of the mode signal generation circuit 40*d* is described taking the transition between the first test mode TM1 and the normal mode as an example. Moreover, the association among the first test mode TM1 and the normal mode, the signal levels of the mode signals Sm1 and Sm2, and the specific transition patterns (the first mode and the fourth mode) is described in the same case as the above-mentioned example.

Figure 7:
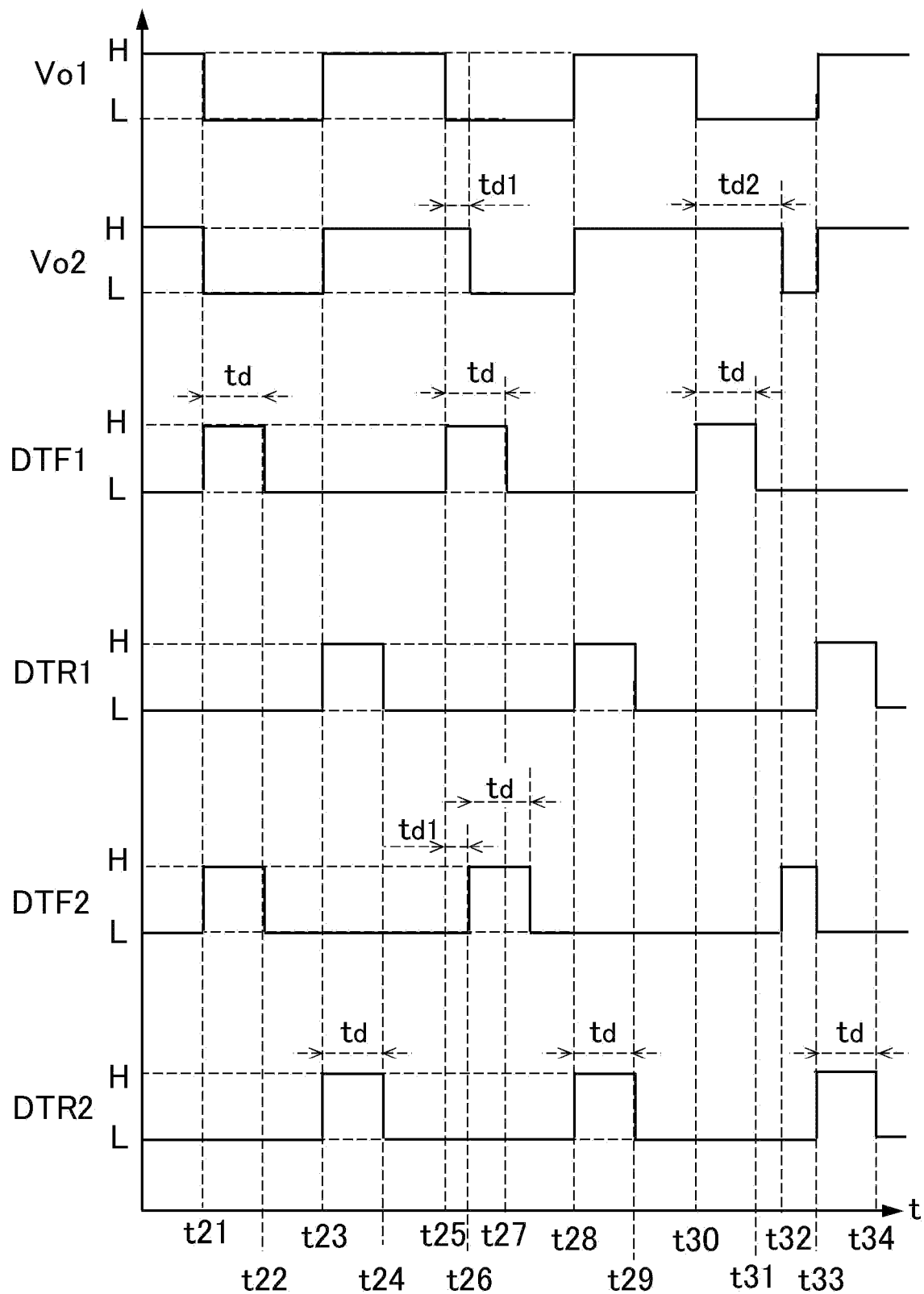
FIG. 7 is an explanatory diagram illustrating time transitions of the first output voltage, the second output voltage, a first rising edge detection signal, a first falling edge detection signal, a second rising edge detection signal, and a second falling edge detection signal, among signals related to an operation in the test mode.

FIG. 7 is an explanatory diagram illustrating time transitions of the first output voltage Vo1, the second output voltage Vo2, the first rising edge detection signal DTR1, the first falling edge detection signal DTF1, the second rising edge detection signal DTR2, and the second falling edge detection signal DTF2, among signals related to an operation in the first test mode TM1.

Figure 8:
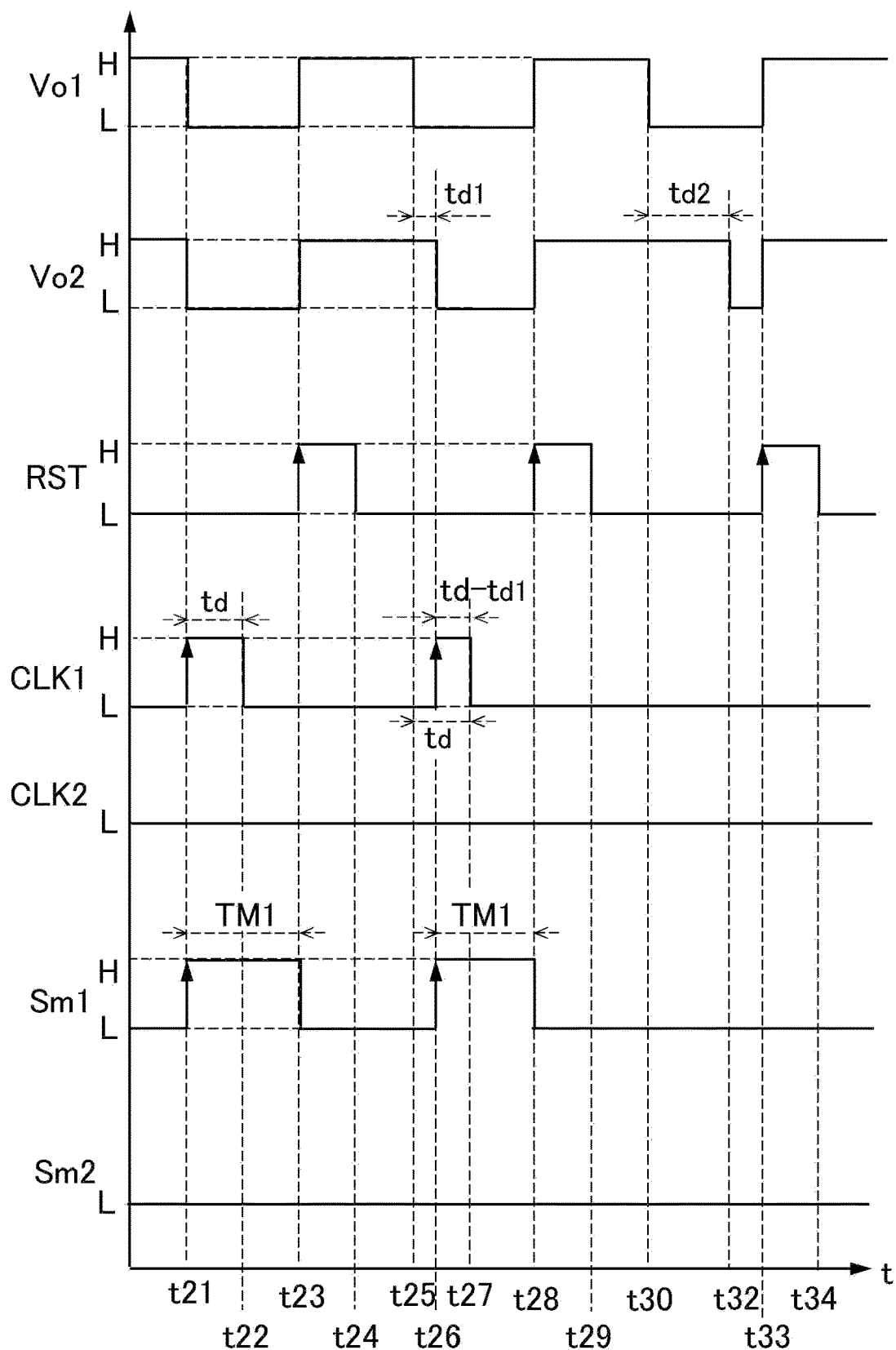
FIG. 8 is an explanatory diagram illustrating time transitions of the first output voltage, the second output voltage, a reset signal, a first clock signal, a second clock signal, the first mode signal, and the second mode signal, among signals related to an operation in a first test mode.

FIG. 8 is an explanatory diagram illustrating time transitions of the first output voltage Vo1, the second output voltage Vo2, the reset signal RST, the first clock signal CLK1, the second clock signal CLK2, the mode signal Sm1, and the mode signal Sm2, among the signals related to the operation in the first test mode TM1.

Here, FIGS. 7 and 8 are divided into two diagrams due to the region which can be illustrated. The first output voltage Vo1, the second output voltage Vo2, a time axis t, and the time t=t21 to t34 illustrated in FIG. 7 respectively have the same contents as the first output voltage Vo1, the second output voltage Vo2, the time axis t, and the time t=t21 to t34 illustrated in FIG. 8.

First, an operation where the second output voltage Vo2 is not delayed with respect to the first output voltage Vo1 is described. The operation where the second output voltage Vo2 is not delayed with respect to the first output voltage Vo1 is an operation in a time zone from the time t=t21 to t24 and an operation where a delay time td1=0.

At the time t=t21, the voltage levels of the first output voltage Vo1 and the second output voltage Vo2 both transition from a high level to a low level. Then, the first edge detection circuit 41*a* detects the falling edge of the first output voltage Vo1 and transitions the first falling edge detection signal DTF1 to a high level during a time td. The second edge detection circuit 41*b* detects the falling edge of the second output voltage Vo2 and transitions the second falling edge detection signal DTF2 to a high level during the time td. The time td corresponds to the predetermined time described above, that is, the time width regarded as simultaneous.

In addition, the determination circuit 43 determines that the first pattern is present based on the first rising edge detection signal DTR1 of a low level, the first falling edge detection signal DTF1 of a high level, the second rising edge detection signal DTR2 of a low level, and the falling edge detection signal DTF2 of a high level.

The determination circuit 43 outputs the first clock signal CLK1, the second clock signal CLK2, and the reset signal RST corresponding to the determination result of the presence/absence of the specific transition patterns. If the determination circuit 43 determines that the first pattern is present, the determination circuit 43 transmits the first clock signal CLK1 of a high level and the reset signal RST of a low level to the first latch circuit 45*a* and transmits the second clock signal CLK2 of a low level and the reset signal RST of a low level to the second latch circuit 45*b* as determination result signals indicating the determination result that the first pattern is present.

The first latch circuit 45*a* receives the first clock signal CLK1 of a high level and the reset signal RST of a low level from the determination circuit 43, and transitions the mode signal Sm1 to a high level.

During the time td from the time t=t21, the first edge detection circuit 41*a* continues the high level of the first falling edge detection signal DTF1. The second edge detection circuit 41*b* continues the high level of the second falling edge detection signal DTF2. The determination circuit 43 continues the high level of the first clock signal CLK1.

At the time t=t22 when the time td has elapsed from the time t=t21, the first edge detection circuit 41*a* and the second edge detection circuit 41*b* respectively transition the first falling edge detection signal DTF1 and the second falling edge detection signal DTF2 from a high level to a low level. On the other hand, the first latch circuit 45*a* continues the high level of the mode signal Sm1.

Subsequently, at the time t=t23, the voltage levels of the first output voltage Vo1 and the second output voltage Vo2 both transition from a low level to a high level. Then, the first edge detection circuit 41*a* detects the rising edge of the first output voltage Vo1 and transitions the first rising edge detection signal DTR1 to a high level during the time td. The second edge detection circuit 41*b* detects the rising edge of the second output voltage Vo2 and transitions the second rising edge detection signal DTR2 to a high level during the time td.

In addition, the determination circuit 43 determines that the fourth pattern is present based on the first rising edge detection signal DTR1 of a high level, the first falling edge detection signal DTF1 of a low level, the second rising edge detection signal DTR2 of a high level, and the second falling edge detection signal DTF2 of a low level.

If the determination circuit 43 determines that the fourth pattern is present, the determination circuit 43 transmits the first clock signal CLK1 of a low level and the reset signal RST of a high level to the first latch circuit 45*a* and transmits the second clock signal CLK2 of a low level and the reset signal RST of a high level to the second latch circuit 45b as determination result signals indicating the determination result that the fourth pattern is present. The first latch circuit 45a receives the reset signal RST of a high level from the determination circuit 43 and transitions the mode signal Sm1 to a low level.

During the time td from the time t=t23, the first edge detection circuit 41a continues the high level of the first rising edge detection signal DTR1. The second edge detection circuit 41b continues the high level of the second rising edge detection signal DTR2.

At the time t=t24 when the time td has elapsed from the time t=t23, the first edge detection circuit 41a and the second edge detection circuit 41b respectively transition the first rising edge detection signal DTR1 and the second rising edge detection signal DTR2 from a high level to a low level. The determination circuit 43 transitions the reset signal RST from a high level to a low level.

Subsequently, an operation where the second output voltage Vo2 is delayed within a predetermined time with respect to the first output voltage Vo1 is described. The operation where the second output voltage Vo2 is delayed within a predetermined time with respect to the first output voltage Vo1 is an operation in a time zone from the time t=t25 to t29 and an operation where the time delay td1 is less than or equal to the time td (td1≤td).

At the time t=t25, the voltage level of the first output voltage Vo1 transitions from a high level to a low level. Then, the first edge detection circuit 41a detects the falling edge of the first output voltage Vo1 and transitions the first falling edge detection signal DTF1 to a high level during the time td.

At the time t=t26 delayed from the time t=t25 by the delay time td1, the voltage level of the second output voltage Vo2 transitions from a high level to a low level. Then, the second edge detection circuit 41b detects the falling edge of the second output voltage Vo2, and transitions the second falling edge detection signal DTF2 to a high level during the time td.

In addition, at the time t=t26, the determination circuit 43 determines that the first pattern is present based on the first rising edge detection signal DTR1 of a low level and the first falling edge detection signal DTF1 of a high level which are received at the time t=t25, and the second rising edge detection signal DTR2 of a low level and the second falling edge detection signal DTF2 of a high level which are received at the time t=t26.

If the determination circuit 43 determines that the first pattern is present, the determination circuit 43 transmits the first clock signal CLK1 of a high level and the reset signal RST of a low level to the first latch circuit 45a and transmits the second clock signal CLK2 of a low level and the reset signal RST of a low level to the second latch circuit 45b as determination result signals indicating the determination result that the first pattern is present. The first latch circuit 45a receives the first clock signal CLK1 of a high level and the reset signal RST of a low level from the determination circuit 43 and transitions the mode signal Sm1 to a high level.

The first edge detection circuit 41a continues the high level of the first falling edge detection signal DTF1 during the time td from the time t=t25. The second edge detection circuit 41b continues the high level of the second falling edge detection signal DTF2 during the time td from the time t=t26. The determination circuit 43 continues the high level of the first clock signal CLK1 during the time td from the time t=t25 during which the high level of the first falling edge detection signal DTF1 is continued, that is, during the time td−td1 from the time t=t26.

Subsequently, at the time t=t27, which is a time after the time td from the time t=t25 and a time after the time td−td1 from the time t=t26, the first edge detection circuit 41a transitions the first falling edge detection signal DTF1 from a high level to a low level. The determination circuit 43 transitions the first clock signal CLK1 from a high level to a low level. On the other hand, the first latch circuit 45a continues the high level of the mode signal Sm1. Furthermore, after the time td has elapsed from the time t=t26, the second edge detection circuit 41b transitions the second falling edge detection signal DTF2 from a high level to a low level.

Subsequently, at the time t=t28, the voltage levels of the first output voltage Vo1 and the second output voltage Vo2 both transition from a low level to a high level. The transitions of the voltage levels of the first output voltage Vo1 and the second output voltage Vo2 at the time t=t28 are the same as the transitions of the voltage levels of the first output voltage Vo1 and the second output voltage Vo2 at the time t=t23 described above. The first edge detection circuit 41a, the second edge detection circuit 41b, the determination circuit 43, the first latch circuit 45a, and the second latch circuit 45b at the time t=t28 respectively operate in the same manner as the first edge detection circuit 41a, the second edge detection circuit 41b, the determination circuit 43, the first latch circuit 45a, and the second latch circuit 45b at the time t=t23 described above.

Subsequently, at the time t=t29, the first edge detection circuit 41a and the second edge detection circuit 41b respectively transition the first rising edge detection signal DTR1 and the second rising edge detection signal DTR2 from a high level to a low level. The determination circuit 43 transitions the reset signal RST from a high level to a low level.

Subsequently, an operation where the second output voltage Vo2 is delayed for more than the predetermined time with respect to the first output voltage Vo1 is described. The operation where the second output voltage Vo2 is delayed for more than the predetermined time with respect to the first output voltage Vo1 is an operation in a time zone from the time t=t30 to t34 and an operation where a delay time td2 is greater than td (td2>td).

At the time t=t30, the voltage level of the first output voltage Vo1 transitions from a high level to a low level. Then, the first edge detection circuit 41a detects the falling edge of the first output voltage Vo1, and transitions the first falling edge detection signal DTF1 to a high level during the time td. Subsequently, at the time t=t31 delayed from the time t=t30 by the time td, the first edge detection circuit 41a transitions the first falling edge detection signal DTF1 to a low level.

At the time t=t32 delayed from the time t=t30 by the delay time td2, the voltage level of the second output voltage Vo2 transitions from a high level to a low level. Then, the second edge detection circuit 41b detects the falling edge of the second output voltage Vo2, and transitions the second falling edge detection signal DTF2 to a high level during the time td.

Subsequently, at the time t=t32, the determination circuit 43 determines that there is no specific transition pattern based on the first rising edge detection signal DTR1 of a low level and the first falling edge detection signal DTF1 of a high level which are received at the time t=t30, the first falling edge detection signal DTF1 of a low level which is received at the time t=t31, and the second rising edge detection signal DTR2 of a low level and the second falling edge detection signal DTF2 of a high level which are received at the time t=t32.

The reason for the determination result is that the voltage level of the second output voltage Vo2 transitions from a high level to a low level at the time t=t32 when a time greater than the time td has elapsed from the time t=t30 at which the voltage level of the first output voltage Vo1 transitions from a high level to a low level. That is, the reason is that the first pattern did not occur within the predetermined time.

If the determination circuit 43 determines that there is no specific transition pattern at the time t=t32, the determination circuit 43 transmits the first clock signal CLK1 of a low level and the reset signal RST of a low level to the first latch circuit 45a and transmits the second clock signal CLK2 of a low level and the reset signal RST of a low level to the second latch circuit 45b as determination result signals indicating the determination result that there is no specific transition pattern.

Subsequently, at the time t=t33, the voltage levels of the first output voltage Vo1 and the second output voltage Vo2 both transition from a low level to a high level. The transitions of the voltage levels of the first output voltage Vol and the second output voltage Vo2 at the time t=t33 are the same as the transitions of the voltage levels of the first output voltage Vol and the second output voltage Vo2 at the time t=t23 and 28 described above. The first edge detection circuit 41a, the second edge detection circuit 41b, the determination circuit 43, the first latch circuit 45a, and the second latch circuit 45b at the time t=t33 respectively operate in the same manner as the first edge detection circuit 41a, the second edge detection circuit 41b, the determination circuit 43, the first latch circuit 45a, and the second latch circuit 45b at the time t=t23 and 28 described above.

Subsequently, at the time t=t34, the first edge detection circuit 41a and the second edge detection circuit 41b respectively transition the first rising edge detection signal DTR1 and the second rising edge detection signal DTR2 from a high level to a low level. The determination circuit 43 transitions the reset signal RST from a high level to a low level.

Next, another configuration example (variation example) of the magnetic sensor circuit according to the embodiment is described.

Figure 9:
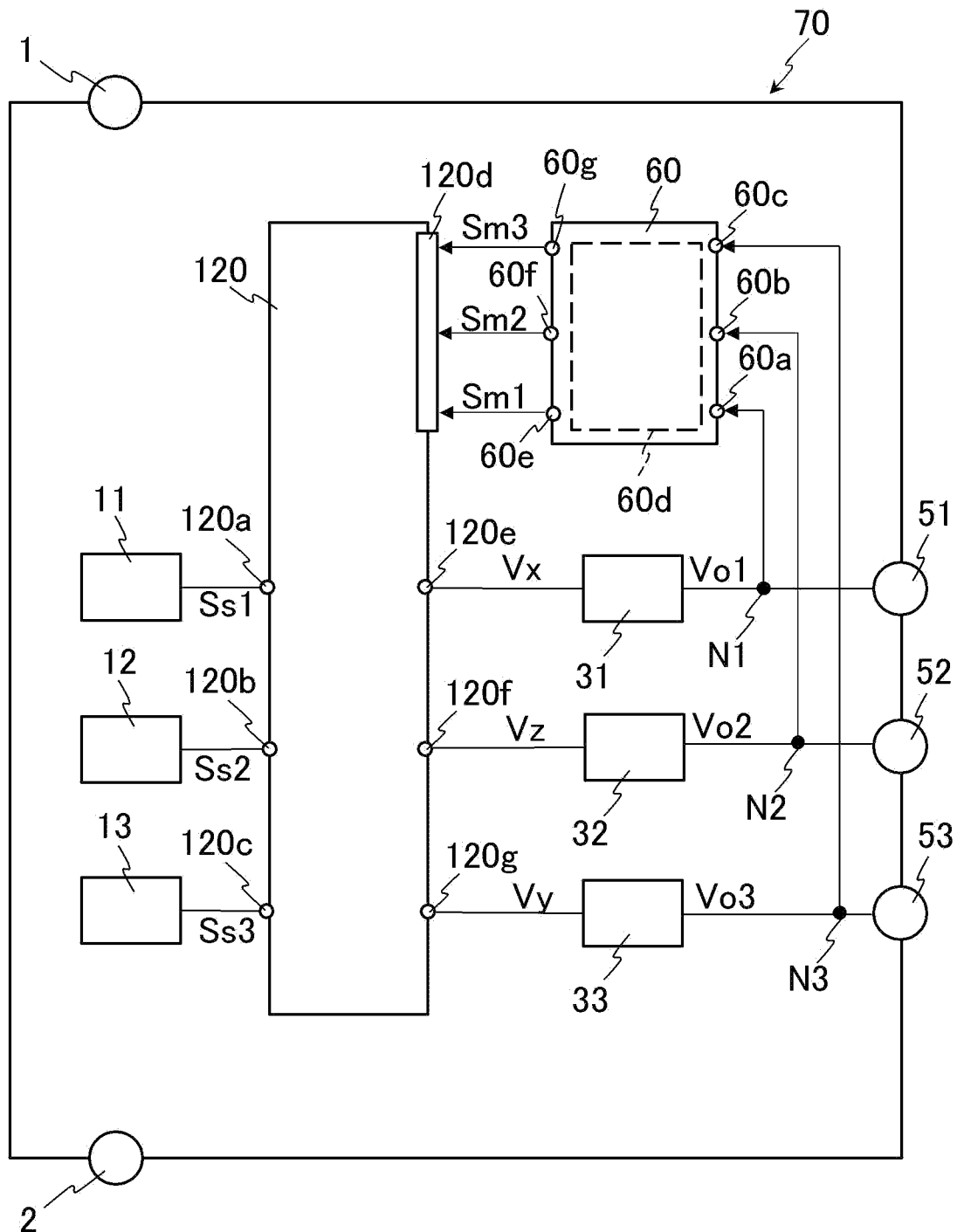
FIG. 9 is a circuit diagram illustrating a second configuration example of the magnetic sensor circuit according to the embodiment.

FIG. 9 is a circuit diagram of a magnetic sensor circuit 70 which is an example (a second configuration example) of the magnetic sensor circuit according to the embodiment.

The magnetic sensor circuit 70 differs from the magnetic sensor circuit 10 having two magnetic detection axes (X-axis, Z-axis) which are orthogonal to each other in that the magnetic sensor circuit 70 is configured to have three magnetic detection axes (X-axis, Y-axis, Z-axis) which are orthogonal to each other.

The magnetic sensor circuit 70 differs from the magnetic sensor circuit 10 in that the magnetic sensor circuit 70 is configured to further include a magnetic sensor 13 and a driver 33, and include a signal processing circuit 120 instead of the signal processing circuit 20 and a voltage monitoring circuit 60 instead of the voltage monitoring circuit 40. The magnetic sensor circuit 70 is the same as the magnetic sensor circuit 10 except for the above differences. The signal processing circuit 120 and the voltage monitoring circuit 60 are configured to be compatible with the three magnetic detection axes with respect to the signal processing circuit 20 and the voltage monitoring circuit 40, respectively.

The magnetic sensor 13 serving as a third magnetic sensor detects a magnetic flux density in a Y-axis direction serving as a third direction, and contains an output port which outputs a third sensor signal Ss3 based on the detected magnetic flux density.

The signal processing circuit 120 contains input ports 120a, 120b, and 120c serving as first, second, and third sensor signal input ports, an input port 120d serving as a mode signal input port, and output ports 120e to 120g. The input port 120c serving as the third sensor signal input port, a part of the input port 120d, and the output port 120g are added to the signal processing circuit 20.

The signal processing circuit 120 receives the third sensor signal Ss3 from the input port 120c, generates a third detection signal based on the third sensor signal Ss3, and sends the third detection signal from the output port 120g to the driver 33. Similar to the first and second detection signals, the third detection signal is a logic signal transitioning between low and high levels, and exhibits hysteresis characteristics.

In addition, the signal processing circuit 120 receives three mode signals from the input port 120d, that is, the mode signals Sm1, Sm2, and Sm3 which are the first, second, and third mode signals. The input port 120d is configured as a mode signal input port of a mode signal including the mode signal Sm3 with respect to the input port 20d. The signal processing circuit 120 receives the three mode signals Sm1, Sm2, and Sm3 which are the first, second, and third mode signals as a 3-bit signal. In the signal processing circuit 120, a maximum of 8 (=$2^3$) patterns including the normal mode can be set.

The driver 33 serving as a third driver contains an input port to which a voltage of the third detection signal is input, and an output port which outputs a third output voltage Vo3 based on the voltage input to the input port. The output port of the driver 33 is connected to the output terminal 53.

The voltage monitoring circuit 60 includes a mode signal generation circuit 60d whose function has been expanded for the three detection axes, and is configured to be capable of generating three mode signals having a plurality of different signal levels in accordance with the transition patterns of the voltage levels of the three output voltages applied thereto. The voltage monitoring circuit 60 includes: input ports 60a, 60b, and 60c to which the first, second, and third output voltages Vo1, Vo2, and Vo3 are respectively input; the mode signal generation circuit 60d which generates the mode signals Sm1, Sm2, and Sm3; and output ports 60e, 60f, and 60g which respectively output the mode signals Sm1, Sm2, and Sm3.

The input ports 60a, 60b, and 60c are respectively connected to the respective output ports of the drivers 31, 32, and 33. The output ports 60e, 60f, and 60g are connected to the input port 120d.

The output terminal 53 is connected to the output port of the driver 33 and the input port 60c serving as an output voltage input port. A connection point of the output port of the driver 33, the output terminal 53, and the input port 60c is a node N3.

In the magnetic sensor circuit 70, the output terminals 51, 52, and 53 constitute a terminal group. The output terminal 53 is one terminal constituting the terminal group, and is configured to be connectable to an external circuit (not illustrated) and capable of supplying the third output voltage Vo3 to the connected external circuit.

Similar to the magnetic sensor circuit 10, the magnetic sensor circuit 70 transitions between the normal mode and the test mode by supplying the first, second, and third output voltages Vo1, Vo2, and Vo3 whose voltage levels transition in specific transition patterns to the voltage monitoring circuit 60. That is, the inspection device applies a predetermined magnetic field or forcibly applies the first, second, and third output voltages Vo1, Vo2, and Vo3 to the output terminals 51, 52, and 53, and thereby switches the mode of the magnetic sensor circuit 70.

In addition, the magnetic sensor circuit having three magnetic detection axes which are orthogonal to each other may include a voltage monitoring circuit with three inputs and two outputs. That is, the magnetic sensor circuit with three magnetic detection axes which are orthogonal to each other may include three output voltage input ports, output ports which output two mode signals, and a main circuit having a voltage monitoring function. The voltage monitoring circuit with three inputs and two outputs is configured to be capable of outputting two output voltages which can be selected from three inputs, that is, the first, second, and third output voltages Vo1, Vo2, and Vo3.

Figure 10:
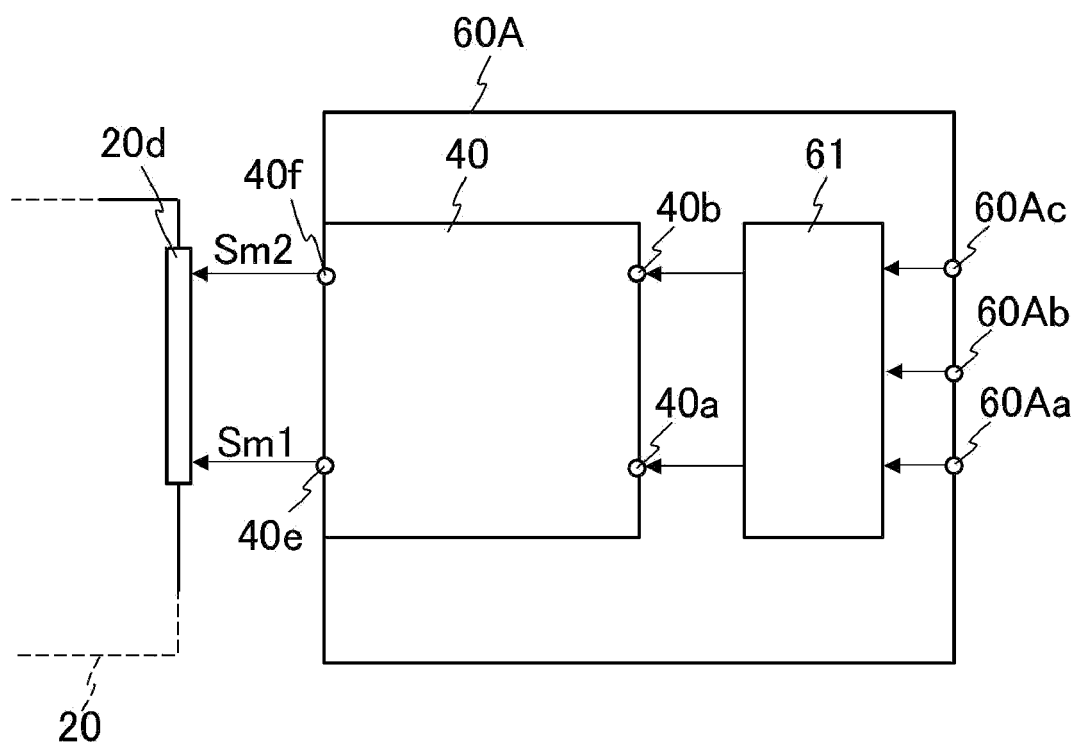
FIG. 10 is a circuit diagram illustrating a variation example of the voltage monitoring circuit including three output voltage input ports and output ports which is configured to output two mode signals.

FIG. 10 is a circuit diagram illustrating a voltage monitoring circuit 60A which is an example of the voltage monitoring circuit with three inputs and two outputs.

The voltage monitoring circuit 60A includes, for example, a selection circuit 61 which selects two output voltages supplied to the main circuit from the first, second, and third output voltages Vo1, Vo2, and Vo3 input thereto, and a voltage monitoring circuit 40 containing output ports which output two mode signals based on the two output voltages supplied to the main circuit.

The selection circuit 61 contains input ports 60Aa, 60Ab, and 60Ac serving as three output voltage input ports of the voltage monitoring circuit 60A. The selection circuit 61 selects two output voltages supplied to the main circuit from the first, second, and third output voltages Vo1, Vo2, and Vo3 which are respectively input from the input ports 60Aa, 60Ab, and 60Ac. A circuit example for selecting two output voltages may be, for example, a switch capable of switching between two connected to the input ports 60Aa, 60Ab, and 60Ac or one disconnected, or a logic circuit which executes a logical operation to select two output voltages or exclude one output voltage from the first, second, and third output voltages Vo1, Vo2, and Vo3.

The voltage monitoring circuit 40 functions as the main circuit of the voltage monitoring circuit 60A and the output ports of the voltage monitoring circuit 60A in the voltage monitoring circuit 60A.

In the embodiment, the magnetic sensor circuits 10 and 70 include a signal processing circuit 20 which receives a mode signal as a 2-bit signal. However, the signal processing circuit 20 may receive a mode signal as a 1-bit signal. In addition, the voltage monitoring circuit included in the magnetic sensor circuit 10 is not necessarily limited to the voltage monitoring circuit 40. The voltage monitoring circuit included in the magnetic sensor circuit 70 is not limited to the voltage monitoring circuits 60 and 60A.

The voltage monitoring circuit included in the magnetic sensor circuits 10 and 70 may include one normal mode and at least one test mode. More specifically described, the magnetic sensor circuit 10 may include a voltage monitoring circuit configured to be capable of outputting a plurality of four or less, that is, two, three, or four mode signals. Further, the magnetic sensor circuit 70 may include a voltage monitoring circuit configured to be capable of outputting a plurality of eight or less, that is, any number of two to eight mode signals.

Figure 11:
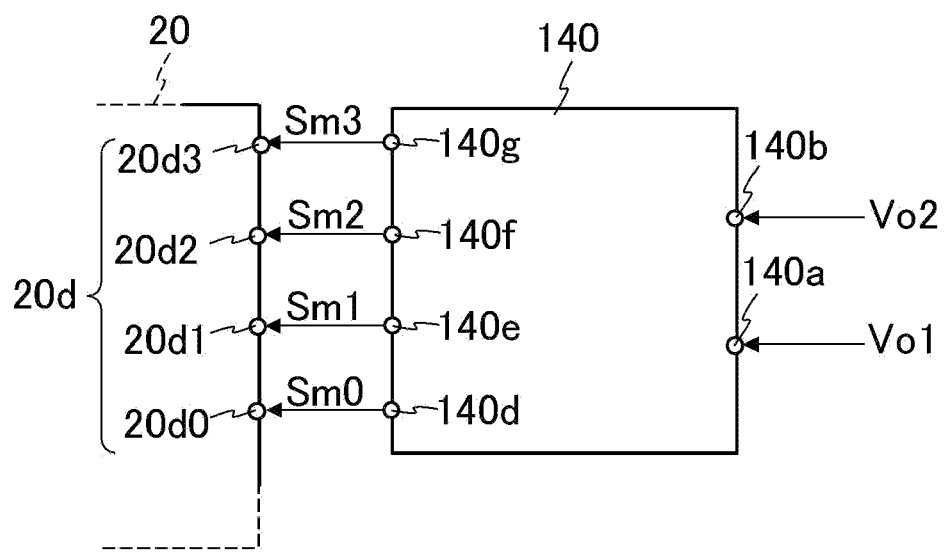
FIG. 11 is a circuit diagram illustrating a variation example of the voltage monitoring circuit including two output voltage input ports.
Figure 12:
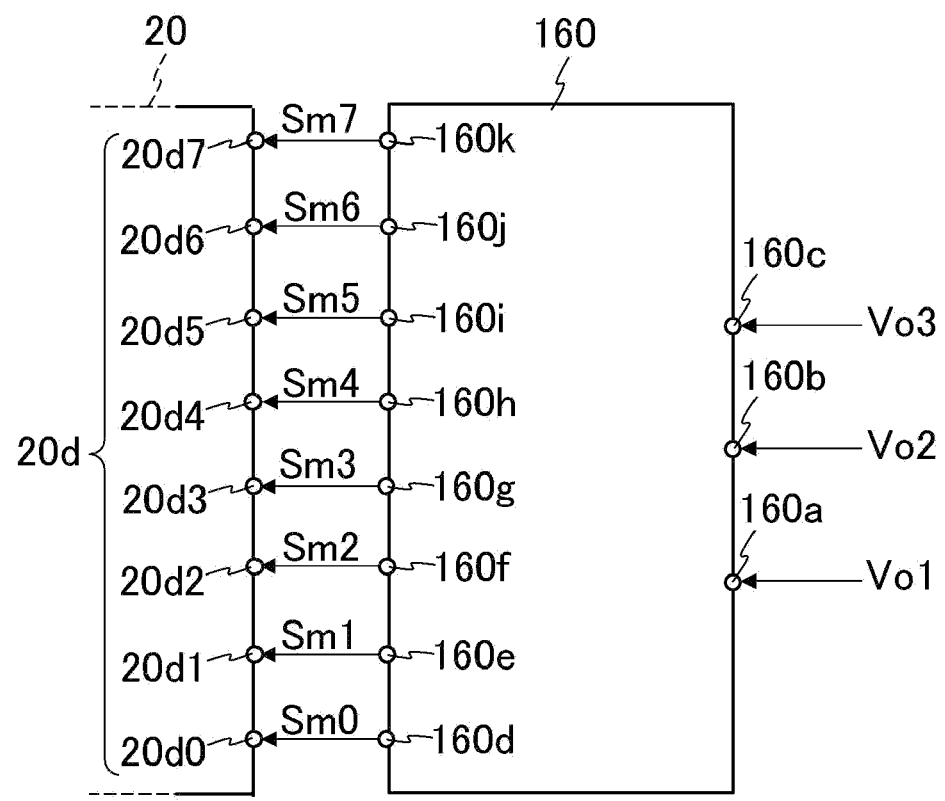
FIG. 12 is a circuit diagram illustrating a variation example of the voltage monitoring circuit including three output voltage input ports.

FIGS. 11 and 12 are respectively circuit diagrams illustrating a voltage monitoring circuit 140 and a voltage monitoring circuit 160.

The magnetic sensor circuit 10 may include, for example, a voltage monitoring circuit 140 which includes four output ports 140d, 140e, 140f, and 140g and respectively outputs mode signals Sm0, Sm1, Sm2, and Sm3 which are 1-bit signals from the output ports 140d, 140e, 140f, and 140g, instead of the voltage monitoring circuit 40 which outputs two mode signals, namely the first and second mode signals Sm1 and Sm2 (see FIG. 11).

The magnetic sensor circuit 70 may include, for example, a voltage monitoring circuit 160 which includes eight output ports 160d, 160e, 160f, 160g, 160h, 160i, 160j, and 160k and respectively outputs mode signals Sm0 to Sm7 which are 1-bit signals from the output ports 160d to 160k, instead of the voltage monitoring circuit 60 which outputs three mode signals, namely the first, second, and third mode signals Sm1, Sm2, and Sm3 (see FIG. 12).

As described above, the magnetic sensor circuit according to the embodiment is configured to maintain the current mode or transition to another mode between a plurality of modes including a normal mode and at least one test mode based on transitions of voltage levels of two or three output voltages. The magnetic sensor circuit configured as described above can reduce accidental mode transitions, that is, unintended mode transitions, compared with a conventional magnetic sensor circuit. For example, even if short circuit occurs between the output terminals 51, 52, and 53, the magnetic sensor circuit according to the embodiment can avoid the entry into a wrong test mode.

In addition, the magnetic sensor circuit according to the embodiment can correspond each of the plurality of modes with the transition patterns based on the transitions of the levels of two or three output voltages. According to the magnetic sensor circuit configured as described above, not only one test mode but also a plurality of test modes can be set. For example, because the maximum number of transition patterns of the levels of two output voltages is four, not only one test mode but also a plurality of three or less, i.e., two or three test modes can be set in the magnetic sensor circuit according to the embodiment.

Moreover, the present invention is not limited to the above-described embodiment as it is, and can be implemented in various forms other than the above-described examples at the implementation stage. Various omissions, substitutions, and changes can be made without departing from the gist of the present invention.

In addition, in the above-described embodiment, the transition from the normal mode to the test mode and the transition from the test mode to the normal mode of the magnetic sensor circuits 10 and 70 have been described, but the transition between the modes is not limited hereto. For example, the magnetic sensor circuits 10 and 70 including a plurality of test modes can also directly transition from the first test mode TM1 to the second test mode TM2. That is, the transition between the test modes can be made without going through the normal mode.

In the above-described embodiment, the example has been described in which the magnetic sensor circuit 70 includes the voltage monitoring circuit 60A which outputs two independent mode signals Sm1 and Sm2, but the two independent mode signals output from the voltage monitoring circuit 60A do not necessarily have to be the mode signals Sm1 and Sm2. The two independent mode signals output from the voltage monitoring circuit 60A may be two mode signals arbitrarily selectable from the mode signals Sm1 to Sm3.

For example, the voltage monitoring circuit 60A which is configured to select the first and third output voltages Vo1 and Vo3 as the two output voltages can output the mode signals Sm1 and Sm3. In addition, the voltage monitoring circuit 60A which is configured to select the second and third output voltages Vo2 and Vo3 as the two output voltages can output the mode signals Sm2 and Sm3.

In the above-described embodiment, the case has been described in which the inspection device forcibly applies the first output voltage Vo1 to the output terminal 51 and forcibly applies the second output voltage Vo2 to the output terminal 52, but the present invention is not limited to hereto. The inspection device may generate a predetermined magnetic field. That is, by imparting the magnetic flux densities Bx and Bz due to the predetermined magnetic field to the magnetic sensor circuit 10, an operation equivalent to the case of forcibly applying the first output voltage Vo1 to the output terminals 51 and forcibly applying the second output voltage Vo2 to the output terminal 52 may be performed.

In the embodiment, the determination circuit 43 is described as a configuration example capable of determining that the voltage levels of the two output voltages have transitioned within a predetermined time. The determination circuit 43 described above is an example of taking a time point at which the transition of the voltage level of the first output voltage Vo1 occurs (hereinafter referred to as "first transition point") as a reference point and determining whether or not the delay time from this reference point to a time point at which the transition of the voltage level of the second output voltage Vo2 occurs (hereinafter referred to as "second transition point") is within a predetermined time.

The determination circuit 43 may be configured to take the second transition point as a reference point and determine whether or not the delay time from this reference point to the first transition point is within a predetermined time. In other words, the determination circuit 43 may be configured to take the first transition point as a reference point and determine whether or not the preceding time from this reference point to the second transition point is within a predetermined time.

Furthermore, the determination circuit 43 may include a switch capable of switching whether the reference point is the first transition point or the second transition point. In the determination circuit 43 which can switch whether the reference point is the first transition point or the second transition point, the delay time when the reference point is the first transition point and the delay time when the reference point is the second transition point may be set to the same lengths, or may be set to different lengths.

In addition, in the embodiment, the case has been described in which the test mode set when the reference point is the first transition point and the test mode set when the reference point is the second transition point have the same contents. However, the test mode set when the reference point is the first transition point and the test mode set when the reference point is the second transition point may have different contents. In this case, the number of test modes which can be set in the magnetic sensor circuits 10 and 70 can be doubled with respect to the number of transition patterns of the levels of the output voltages.

The above-described embodiment or the variation thereof is included in the scope and gist of the present invention, and is also included in the scope of the present invention described in the claims and the equivalent scope thereof

What is claimed is:

1. A magnetic sensor circuit, comprising:
   a first magnetic sensor which detects a magnetic flux density in a first direction and outputs a first sensor signal based on the detected magnetic flux density in the first direction;
   a second magnetic sensor which detects a magnetic flux density in a second direction orthogonal to the first direction and outputs a second sensor signal based on the detected magnetic flux density in the second direction;
   a signal processing circuit which contains a mode signal input port from which mode signals are received, a first sensor signal input port from which the first sensor signal is received, and a second sensor signal input port from which the second sensor signal is received, and which is configured to switch between a normal mode and a test mode in which a predetermined operation different from that of the normal mode is performed, wherein in the normal mode, a first detection signal which transitions between low and high levels is output based on the first sensor signal, while a second detection signal which transitions between low and high levels is output based on the second sensor signal;
   a first driver from which the first detection signal is received in the normal mode while a test signal is received in the test mode, and which outputs a first output voltage based on the received first detection signal or the received test signal;
   a second driver from which the second detection signal is received in the normal mode while the test signal is received in the test mode, and which outputs a second output voltage based on the received second detection signal or the received test signal; and
   a voltage monitoring circuit which receives the first output voltage and the second output voltage, and generates the mode signals having a plurality of different signal levels in accordance with transition patterns of voltage levels of the received first output voltage and the received second output voltage.

2. The magnetic sensor circuit according to claim 1, wherein the voltage monitoring circuit includes:
   an output voltage input port from which the first output voltage and the second output voltage are received;
   a mode signal generation circuit in which any number of two to four specific transition patterns are set from the transition patterns in which the transition of the voltage level of the first output voltage input from the output voltage input port and the transition of the voltage level of the second output voltage input from the output voltage input port occur within a predetermined time, and which generates the mode signals having the same number as a set number of the specific transition patterns and respectively having different signal levels; and
   an output port which outputs the mode signals generated by the mode signal generation circuit.

3. The magnetic sensor circuit according to claim 2, wherein the mode signal generation circuit includes:
   a first edge detection circuit which detects a rising edge and a falling edge of the first output voltage, and which generates a first rising edge detection signal corresponding to the detected rising edge and a first falling edge detection signal corresponding to the detected falling edge;

a second edge detection circuit which detects a rising edge and a falling edge of the second output voltage, and which generates a second rising edge detection signal corresponding to the detected rising edge and a second falling edge detection signal corresponding to the detected falling edge;

a determination circuit which determines presence or absence of the specific transition patterns based on the first rising edge detection signal, the first falling edge detection signal, the second rising edge detection signal, and the second falling edge detection signal, and which generates a determination result signal indicating a determination result; and a signal generation circuit which generates the mode signals based on the determination result signal.

4. The magnetic sensor circuit according to claim 3, wherein the determination circuit is configured to determine the presence or absence of the two to four specific transition patterns which are set among four patterns containing a first pattern in which both the voltage level of the first output voltage and the voltage level of the second output voltage transition from a low level to a high level within the predetermined time, a second pattern in which the voltage level of the first output voltage transitions from a low level to a high level and the voltage level of the second output voltage transitions from a high level to a low level within the predetermined time, a third pattern in which the voltage level of the first output voltage transitions from a high level to a low level and the voltage level of the second output voltage transitions from a low level to a high level within the predetermined time, and a fourth pattern in which both the voltage level of the first output voltage and the voltage level of the second output voltage transition from a high level to a low level within the predetermined time.

5. The magnetic sensor circuit according to claim 1, comprising:

a third magnetic sensor which detects a magnetic flux density in a third direction orthogonal to the first direction and the second direction, and which outputs a third sensor signal based on the detected magnetic flux density in the third direction; and a third driver from which a third detection signal is received in the normal mode while the test signal is received in the test mode, and which outputs a third output voltage based on the received third detection signal or the received test signal;

wherein the signal processing circuit contains a third sensor signal input port from which the third sensor signal is received, and is configured to switch between the normal mode and the test mode, wherein in the normal mode, the third detection signal based on the third sensor signals as well as the first and second detection signals are output, the third detection signal transitioning between low and high levels; and the voltage monitoring circuit is configured to generate the mode signals having a plurality of different signal levels in accordance with transition patterns of voltage levels of the first output voltage, the second output voltage, and the third output voltage.

6. The magnetic sensor circuit according to claim 5, wherein the voltage monitoring circuit comprises:

an output voltage input port from which the first output voltage, the second output voltage, and the third output voltage are received;

a mode signal generation circuit in which any number of two to eight specific transition patterns are set from transition patterns in which the transition of the voltage level of the first output voltage input from the output voltage input port, the transition of the voltage level of the second output voltage input from the output voltage input port, and the transition of the voltage level of the third output voltage input from the output voltage input port occur within a predetermined time, and which generates the mode signals having the same number as a set number of the specific transition patterns and respectively having different signal levels; and an output port which outputs the generated mode signals.

7. The magnetic sensor according to claim 6, wherein the voltage monitoring circuit further comprises a selection circuit which selects two output voltages from the first output voltage, the second output voltage, and the third output voltage which are received from the output voltage input port; and the specific transition patterns are set to any number of two to four among the transition patterns of the voltage levels of the two output voltages selected by the selection circuit.

* * * * *